(12) United States Patent
Radovanov et al.

(10) Patent No.: US 7,700,925 B2
(45) Date of Patent: Apr. 20, 2010

(54) TECHNIQUES FOR PROVIDING A MULTIMODE ION SOURCE

(75) Inventors: Svetlana Radovanov, Marblehead, MA (US); Bon Woong Koo, Andover, MA (US); Frank Sinclair, Quincy, MA (US); Victor M. Benveniste, Gloucester, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 296 days.

(21) Appl. No.: 11/966,312

(22) Filed: Dec. 28, 2007

(65) Prior Publication Data

US 2009/0166554 A1 Jul. 2, 2009

(51) Int. Cl.
*H01J 37/08* (2006.01)

(52) U.S. Cl. .................... 250/423 R; 250/424; 250/427

(58) Field of Classification Search ............. 250/423 R, 250/424, 427
See application file for complete search history.

(56) References Cited

U.S. PATENT DOCUMENTS

| 7,022,999 B2 | 4/2006 | Horsky et al. | |
| 2007/0108395 A1* | 5/2007 | Horsky et al. | ............... 250/489 |

OTHER PUBLICATIONS

Wolf, B. "Ion Sources," CRC Press, 1995.
U.S. Appl. No. 60/833,189, filed Jul. 25, 2006, England et al.

* cited by examiner

*Primary Examiner*—Kiet T Nguyen

(57) ABSTRACT

Techniques for providing a multimode ion source are disclosed. In one particular exemplary embodiment, the techniques may be realized as an apparatus for ion implantation, the apparatus including an ion source having a hot cathode and a high frequency plasma generator, wherein the ion source has multiple modes of operation.

14 Claims, 7 Drawing Sheets

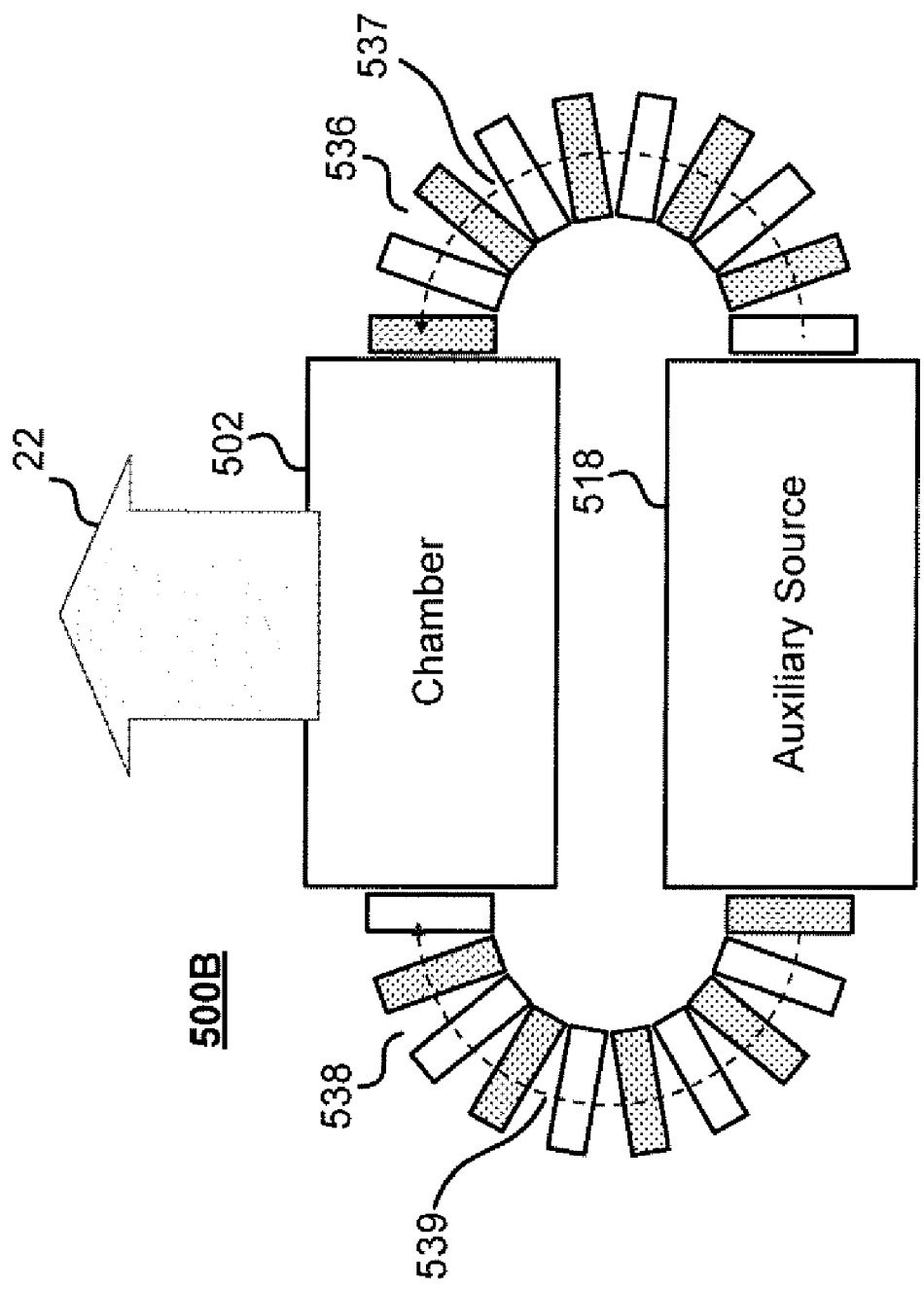

TECHNIQUES FOR PROVIDING A MULTIMODE ION SOURCE

FIELD OF THE DISCLOSURE

The present disclosure relates generally to semiconductor manufacturing equipment and, more particularly, to techniques for providing a multimode ion source.

BACKGROUND OF THE DISCLOSURE

Ion implantation is a process of depositing chemical species into a substrate by direct bombardment of the substrate with energized ions. In semiconductor manufacturing, ion implanters are used primarily for doping processes that alter the type and level of conductivity of target materials. A precise doping profile in an integrated circuit (IC) substrate and its thin-film structure is often crucial for proper IC performance. To achieve a desired doping profile, one or more ion species may be implanted in different doses and at different energy levels.

FIG. 1 depicts a conventional ion implanter system 100. The ion implanter 100 includes a source power 101, an ion source 102, extraction electrodes 104, a 90° magnet analyzer 106, a first deceleration (D1) stage 108, a 70° magnet analyzer 110, and a second deceleration (D2) stage 112. The D1 and D2 deceleration stages (also known as "deceleration lenses") are each comprised of multiple electrodes with a defined aperture to allow an ion beam to pass therethrough. By applying different combinations of voltage potentials to the multiple electrodes, the D1 and D2 deceleration lenses can manipulate ion energies and cause the ion beam to hit a target workpiece 114 at a desired energy. A number of measurement devices 116 (e.g., a dose control Faraday cup, a traveling Faraday cup, or a setup Faraday cup 122) may be used to monitor and control the ion beam conditions.

The ion source 102 is a critical component of the ion implanter system 100. The ion source 102 is required to generate a stable and reliable ion beam 10 for a variety of different ion species and extraction voltages.

FIG. 2 depicts a typical embodiment of an ion source 200 that may be used in the ion implanter system 100. The ion source 200 may be an indirectly heated cathode (IHC) ion source, which is typically used in high current ion implantation systems. The ion source 200 comprises an arc chamber 202 with conductive chamber walls 214. At one end of the arc chamber 202 there is an indirectly heated cathode (IHC) 203 having a cathode 206 with a tungsten filament 204 located therein. The tungsten filament 204 is coupled to a first power supply 208 capable of supplying a high current. The high current may heat the tungsten filament 204 to cause thermionic emission of electrons. A second power supply 210 may bias the cathode 206 at a much higher potential than the tungsten filament 204 to cause the emitted electrons to accelerate towards and heat the cathode 206. Heating the cathode 206 causes the cathode 206 to emit electrons into the arc chamber 202. A third power supply 212 may bias the chamber walls 214 with respect to the cathode 206 so that the electrons are accelerated at a high energy into the arc chamber. A source magnet 224a may create a magnetic field B inside the arc chamber 202 to confine electrons, and a repeller 216 at the other end of the arc chamber 202 may be biased at a same or similar potential as the cathode 206 to repel the electrons. A gas source 218 may supply a dopant species (e.g., $BF_3$, $AsH_3$, $GeF_4$) into the arc chamber 202. The electrons may interact with the dopant species to produce a plasma 20. An extraction electrode (not shown) may then extract ions 22 from the plasma 20 through an extraction aperture 220 for use in the ion implanter 100.

A problem that currently exists in conventional ion implantation is that conventional ion implanters cannot effectively implant dopant species at both low energies (e.g., sub-kev) and high energies (e.g., keV). For example, conventional ion implanters utilizing an IHC ion source are relatively inefficient at transporting low-energy ion beams due to space charge within the ion beams. In general, the lower the energy, the greater the space charge problems.

One approach that has been proposed to solve the problem of low-energy boron implantation is molecular beam ion implantation. That is, instead of implanting an ion current I of atomic $B^+$ ions at an energy E, a decaborane molecular ion ($B_{10}H_x^+$), for example, is implanted at an energy 10×E and at an ion current of 0.10×I. Although the resulting implantation depth and dopant concentration (dose) of both approaches have been shown to be generally equivalent, the decaborane implantation technique may have significant potential advantages. For example, since the transport energy of the decaborane ion is ten times that of a dose-equivalent boron ion and the decaborane current is one-tenth that of the boron current, space charge forces may be substantially reduced when compared to monatomic boron implantation.

While $BF_3$ gas is used by conventional ion sources to generate $B^+$ ions, decaborane ($B_{10}H_{14}$) must be used to generate the decaborane ion $B_{10}H_x^+$. Decaborane is a solid material which has a significant vapor pressure, on the order of 1 Torr at 20° C., melts at 100° C., and decomposes at 350° C. To be vaporized via sublimation, decaborane must be vaporized below 100° C. and must operate in an ion source whose local environment (e.g., chamber wall and chamber components) is below 350° C. to avoid decomposition. In addition, since the decaborane molecule is relatively large, the molecule easily disassociates into smaller components, such as elemental boron or diborane ($B_2H_6$), when subject to charge-exchange interactions within plasma. Therefore, it may be understood why conventional ion sources are not reliable in commercial production. Furthermore, ion source vaporizers typically cannot operate reliably at the low temperatures required for decaborane, due to radiative heating from the ion source to the vaporizer that causes thermal instability of the molecules. For example, vaporizer feed lines easily become clogged with boron deposits from decomposed vapor as the decaborane vapor interacts with their hot surfaces.

Additionally, a conventional ion source is generally incompatible with decaborane ion implantation and/or ion implantation using any other molecular species. Thus, a conventional ion source may only be satisfactory for atomic and small molecular ions.

While conventional ion sources, such as duoplasmatrons, may consist of two plasma regions: a cathode plasma (e.g., between a cathode and an intermediate electrode (IE)) and a high-density plasma (e.g., between the IE and an anode), the plasma is compressed by a double layer into an IE channel and by an axial magnetic field. Although a high axial magnetic field improves the yield of multiply charged ions, this two-region ion source cannot produce sufficiently high intensity electron beams because of high-frequency instabilities and leads to poor ionization of atomic species. As a result, a conventional ion source cannot reliably be used in high current ion implantation situations. Furthermore, in this example, filament lifetime is relatively short because of sputtering of heavy ions.

In addition, operating temperatures of an IHC ion source are typically 800° C. to 2300° C. from the chamber body to the heated cathode. Such extremely high temperatures shorten the performance and lifetime of IHC ion sources. As a result, the performance degradation and short lifetime of IHC ion sources greatly reduce the productivity of ion implanters. While these temperatures are generally required for thermal dissociation and atomic creation during implantation, they are not conducive for producing large molecular ions.

In view of the foregoing, it may be understood that there are significant problems and shortcomings associated with current ion source technologies.

SUMMARY OF THE DISCLOSURE

Technique for providing a multimode ion source are disclosed. In one particular exemplary embodiment, the techniques may be realized as an apparatus for ion implantation, the apparatus may include an ion source having a hot cathode and a high frequency plasma generator, wherein the ion source may have multiple modes of operation.

In accordance with other aspects of this particular exemplary embodiment, the ion source may operate in a first mode using the hot cathode, wherein the first mode is a hot mode operation.

In accordance with further aspects of this particular exemplary embodiment, the ion source may operate in a second mode using the high frequency plasma generator, wherein the second mode of operation is a cold mode operation.

In accordance with additional aspects of this particular exemplary embodiment, the high frequency plasma generator may include at least one of an inductively coupled plasma (ICP) generator, a helicon plasma generator, and a microwave plasma generator.

In accordance with other aspects of this particular exemplary embodiment, the ion source may operate in a third mode of operation using the hot cathode and the high frequency plasma generator.

In accordance with further aspects of this particular exemplary embodiment, the high frequency plasma generator may be coupled to the ion source by at least one plasma pipe.

In accordance with additional aspects of this particular exemplary embodiment, wherein the high frequency plasma generator may be remotely controlled.

In another particular exemplary embodiment, the techniques may be realized as a multi-mode ion source having a chamber, a hot cathode, and a high frequency plasma generator, such that the ion source may have multiple modes of operation.

In accordance with other aspects of this particular exemplary embodiment, the ion source may operate in a first mode using the hot cathode and the ion source may operate in a second mode using the high frequency plasma generator.

In accordance with further aspects of this particular exemplary embodiment, the high frequency plasma generator may include at least one of an inductively coupled plasma (TCP) generator, a helicon plasma generator, and a microwave plasma generator.

In another particular exemplary embodiment, the techniques may be realized as a method for generating ions in an ion source, the method including providing a first mode of operation based on a hot cathode, and providing a second mode of operation based on a high frequency plasma generator.

In accordance with other aspects of this particular exemplary embodiment, the method may further include providing a third mode of operation based on the hot cathode and the high frequency plasma generator.

In another particular exemplary embodiment, the techniques may be realized as a method for cleaning an ion source including providing a high frequency plasma generator to increase gas flow and to control chamber wall temperature, and providing at least one plasma pipe to deliver reactive plasma into an ion source.

In accordance with further aspects of this particular exemplary embodiment, the at least one plasma pipe may include a plurality of ring magnets to form a multi-cusp arrangement.

The present disclosure will now be described in more detail with reference to exemplary embodiments thereof as shown in the accompanying drawings. While the present disclosure is described below with reference to exemplary embodiments, it should be understood that the present disclosure is not limited thereto. Those of ordinary skill in the art having access to the teachings herein will recognize additional implementations, modifications, and embodiments, as well as other fields of use, which are within the scope of the present disclosure as described herein, and with respect to which the present disclosure may be of significant utility.

BRIEF DESCRIPTION OF THE DRAWINGS

In order to facilitate a fuller understanding of the present disclosure, reference is now made to the accompanying drawings, in which like elements are referenced with like numerals. These drawings should not be construed as limiting the present disclosure, but are intended to be exemplary only.

FIG. 5B depicts an ion source having an auxiliary source configuration according to an alternative embodiment of the present disclosure.

DETAILED DESCRIPTION OF EXEMPLARY EMBODIMENTS

Embodiments of the present disclosure to provide a multi-mode ion source having greater molecular ion implantation as well as increased ion source performance and lifetime over conventional ion source technologies. In addition, embodiments of the present disclosure provide various exemplary ion source configurations.

Figure 3A:
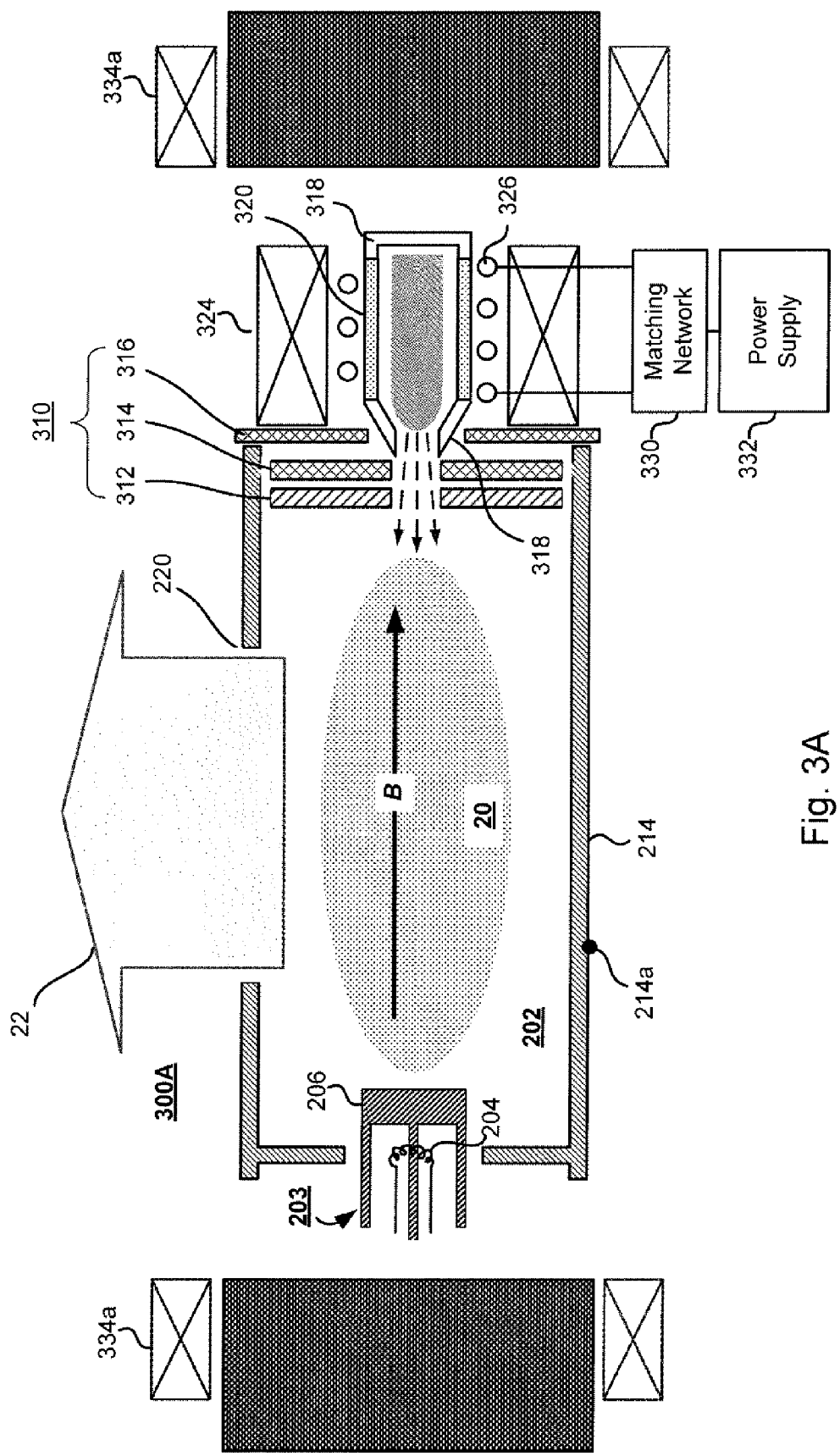
FIG. 3A depicts a multimode ion source according to an embodiment of the present disclosure.

Referring to FIG. 3A, a multimode ion source 300A is shown in accordance with an embodiment of the present disclosure. The multimode ion source 300A may have several modes of operation. These may include at least an arc-discharge mode and a non-arc-discharge mode. An arc-discharge mode of operation may include a hot cathode (HC) (e.g., an indirectly heated cathode (IHC)) mode of operation. An non-arc-discharge mode of operation may include a high frequency mode, a cold plasma cathode (CPC) mode, or a radio frequency (RF) mode. Other various modes of operation may also be provided, including other indirect or high frequency modes of operation.

Figure 1:
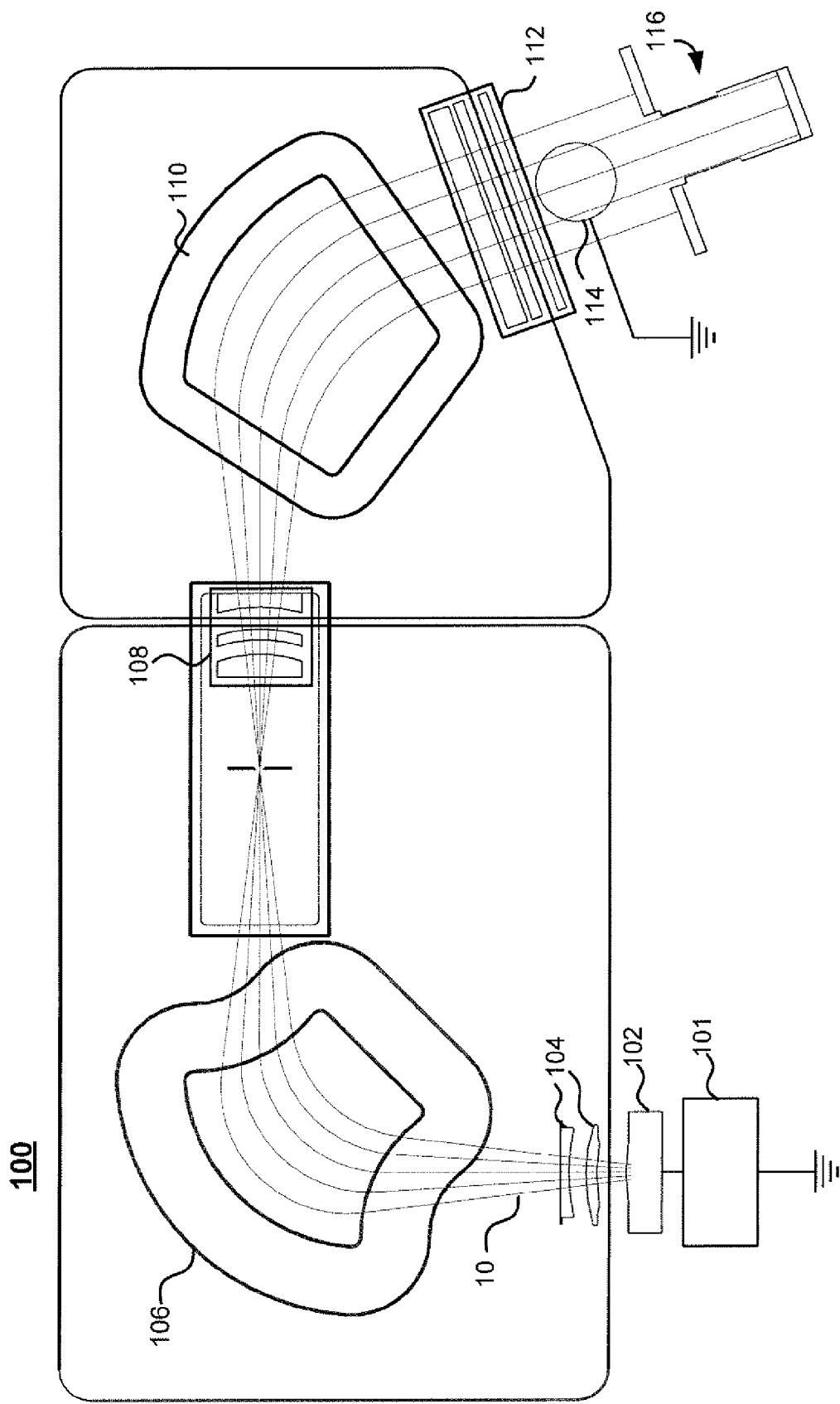
FIG. 1 depicts a conventional ion implanter system.
Figure 2:
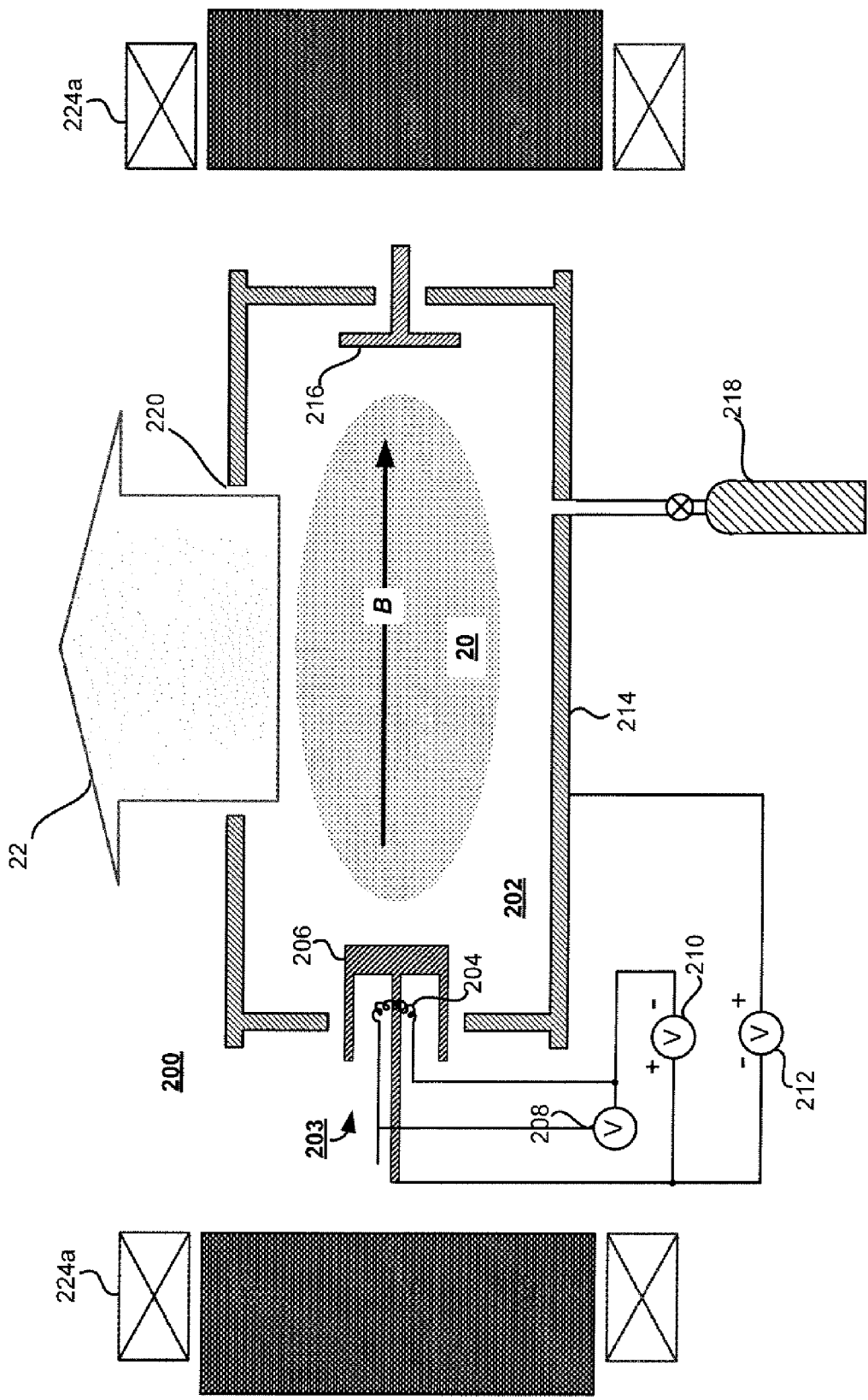
FIG. 2 depicts a conventional ion source.

Similar to the ion source 200 of FIG. 2, the multimode ion source 300A of FIG. 3A may include an arc chamber 202 with conductive chamber walls 214. At one end of the arc chamber 202 there may be an indirectly heated cathode (IHC) 203 having a cathode 206 with a tungsten filament 204 located therein. The tungsten filament 204 and operation of the cathode 206 may be consistent with that of FIG. 2.

However, unlike FIG. 2, which includes a repeller 216, the multimode ion source 300A of FIG. 3A has a set of electrodes 310 positioned within the arc chamber 202 opposite that of the cathode 206. The set of electrodes 310 may have several various configurations. These may include a number of electrodes to extract either plasma, ions, and/or electrons. For example, in one embodiment, the set of electrodes 310 may include at least a plate 312 (e.g. biasing plate), a gate 314 (e.g., gate electrode), and a magnetic shield 316. Other variations may also be provided.

During an arc-discharge mode of operation (e.g., hot cathode HC operation), the plate 312 (which may be negatively charged with respect to the arc chamber) may function as a repeller. For example, the set of electrodes 310 may be used to extract positive and/or negative ions into the main arc chamber 202 and the plate 312 may be biased at a same or similar potential as the cathode 206 to repel electrons. Consequently, electrons may be reflected between the plate 312 and the cathode 206. As a result, the set of electrodes 310 may control energy and flux of electrons that are injected into the arc chamber 202. The multimode ion source 300A may also include source magnet 334a that may create a magnetic field B inside the arc chamber 202 to confine electrons. It should be appreciated that when operating in an arc-discharge mode, the multimode ion source 300A may be used with the same or similar power density as in a standard IHC source. It should also be appreciated that the set of electrodes 310 may be utilized to control electron temperature within the arc chamber 202.

A gas source may also be provided with the multimode ion source 300A. However, unlike FIG. 2, the gas source may be an auxiliary chamber 318 that is attached to the arc chamber 202 at the side of the arc chamber 202 opposite that of the cathode 206 behind an opening in the set of electrodes 310, as depicted in FIG. 3. The auxiliary chamber 318 may supply a dopant species (e.g., BF3, NF3, AsFS, B2H4, decaborane ($B_{10}H_{14}$)) into the arc chamber 202 by passing same through openings in the set of electrodes 310. In one embodiment, the set of electrodes 310 closest to the auxiliary chamber 318 may have a conical shape to provide additional focusing of extracted electrons and provide efficient coupling to molecular vapor in the arc chamber 202. Electrons may interact with the reactive species to produce the plasma 20.

In one embodiment, the auxiliary chamber 318 may have an inductive excitation antenna 326 imbeded in a dielectric 320, for Helicon or inductively coupled plasma (ICP) operation. In another embodiment, the auxiliary chamber 318 may have a generally cylindrical shape such that high frequency excitation (e.g., radio frequency excitation) may facilitate uniform generation of ionized gas within the auxiliary chamber 318. Other various shapes and embodiments may also be provided.

Plasma confinement may be provided by using a magnetic field provided by an adjustable magnetic coil 324. For example, the adjustable magnetic coil 324 may be placed around the auxiliary chamber 318 as a set of electro-magnets so that current in the coil 324 may provide an adjustable magnetic field within the auxiliary chamber 318. A magnetic shield 316 may also be provided between the arc chamber 202 and the adjustable magnetic coil 324. The inductive excitation antenna 326 may be coupled to a matching network 330 (e.g., an RF matching network) and a power supply 332 (e.g., an RF power supply). In one embodiment, a total power of approximately 100-1000 W may be provided by the power supply 332. In another embodiment, gas pressure in the auxiliary chamber 318 may be approximately 1 mTorr. An inert gas (e.g., xenon) or other dopant gas may be used with the auxiliary chamber 318.

For IHC mode of operation, electrons may be blocked by a negative potential applied to the set of electrodes 310, e.g., the gate 314, to function as a "gate" between the auxiliary chamber 318 (e.g., inductively coupled plasma (ICP) chamber) and the arc chamber 202. A positive pulse may be applied to open this "gate" and send electrons into the arc chamber 202 where neutral molecules are present. It should be appreciated that the gate electrode 314 may be used to extract ions when a negative pulse is applied or let plasma flow into the arc chamber 202. Extraction of positive and/or negative ions and/or electrons may also be possible. In one embodiment, the strength of an electric field generated by an extraction pulse may be variable. A repetition rate, for example, may also be set at a predetermined high frequency, such as 10 kHz. An alternative for adjusting electron energy may be to apply a negative potential to the auxiliary chamber 318 relative to an interaction region in the arc chamber 202.

The multimode ion source 300A, as described above, may therefore have both a non-arc-discharge mode (e.g., via a cold high frequency plasma source) and a arc-discharge mode (e.g., via an indirectly heated cathode (IHC) source) that improves molecular ion implantation and increases ion source performance and lifetime. For example, electrons and ions extracted from the cold high frequency plasma source having the requisite energy and intensity may produce molecular ions in the arc chamber 202 without causing molecular fragmentation. The multimode ion source 300A may provide a large flux of low energy electrons (i.e., more than conventional filament-based ion sources), and is therefore capable of larger molecular beam currents. In addition, the set of electrodes 310 that controls the energy and intensity of the electrons and/or ions injected into the arc chamber 202 may enhance plasma uniformity. Furthermore, use of the multimode ion source 300A in a non-arc-discharging mode of operation may avoid excessive heating and reduce additional molecular dissociation. This mode may require active temperature of the wall. Accordingly, a temperature sensor 214a may be provided at the arc chamber wall 214. As a result, generating a cold high frequency plasma as in an IHC ion source without significant changes may enhance ion implantation and ultimately improve semiconductor processing.

Figure 3B:
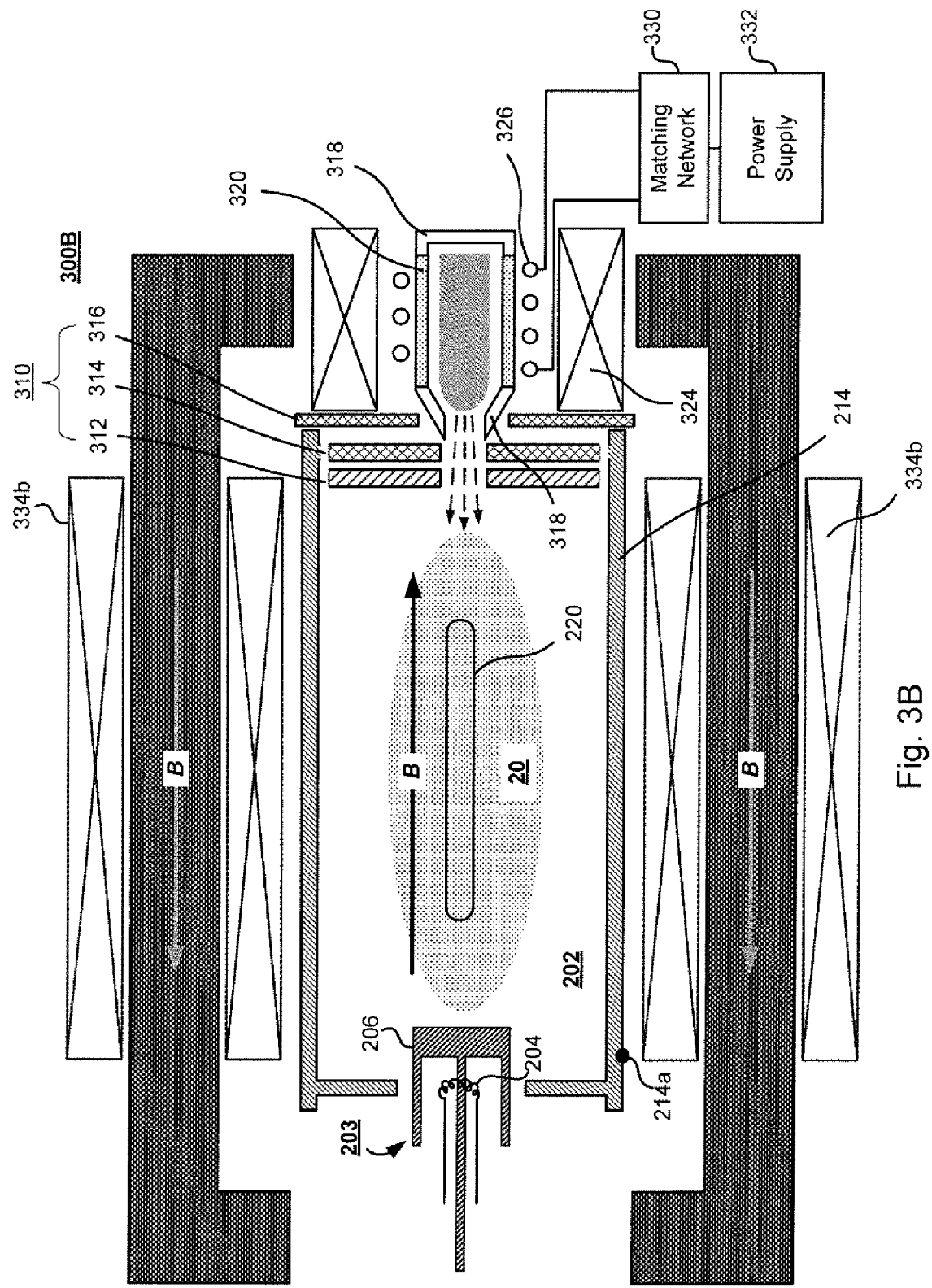
FIG. 3B depicts a multimode ion source according to an alternative embodiment of the present disclosure.

FIG. 3B depicts a multimode ion source 300B according to an alternative embodiment of the present disclosure. In this example, the multimode ion source 300B may include all of the components of the multimode ion source 300A of FIG. 3A. However, FIG. 3B provides an alternative source magnet 334b configuration. For example, rather than being behind the auxiliary chamber 318, source magnet 334b may be positioned at along a length of the arc chamber 202. Such a source magnet 334b configuration may allow more room within the existing architecture for the auxiliary chamber 318 and increase flexibility in overall design (e.g., compactness) without limiting the magnetic field required for optimal plasma confinement in the multimode ion source 300B.

Figure 4:
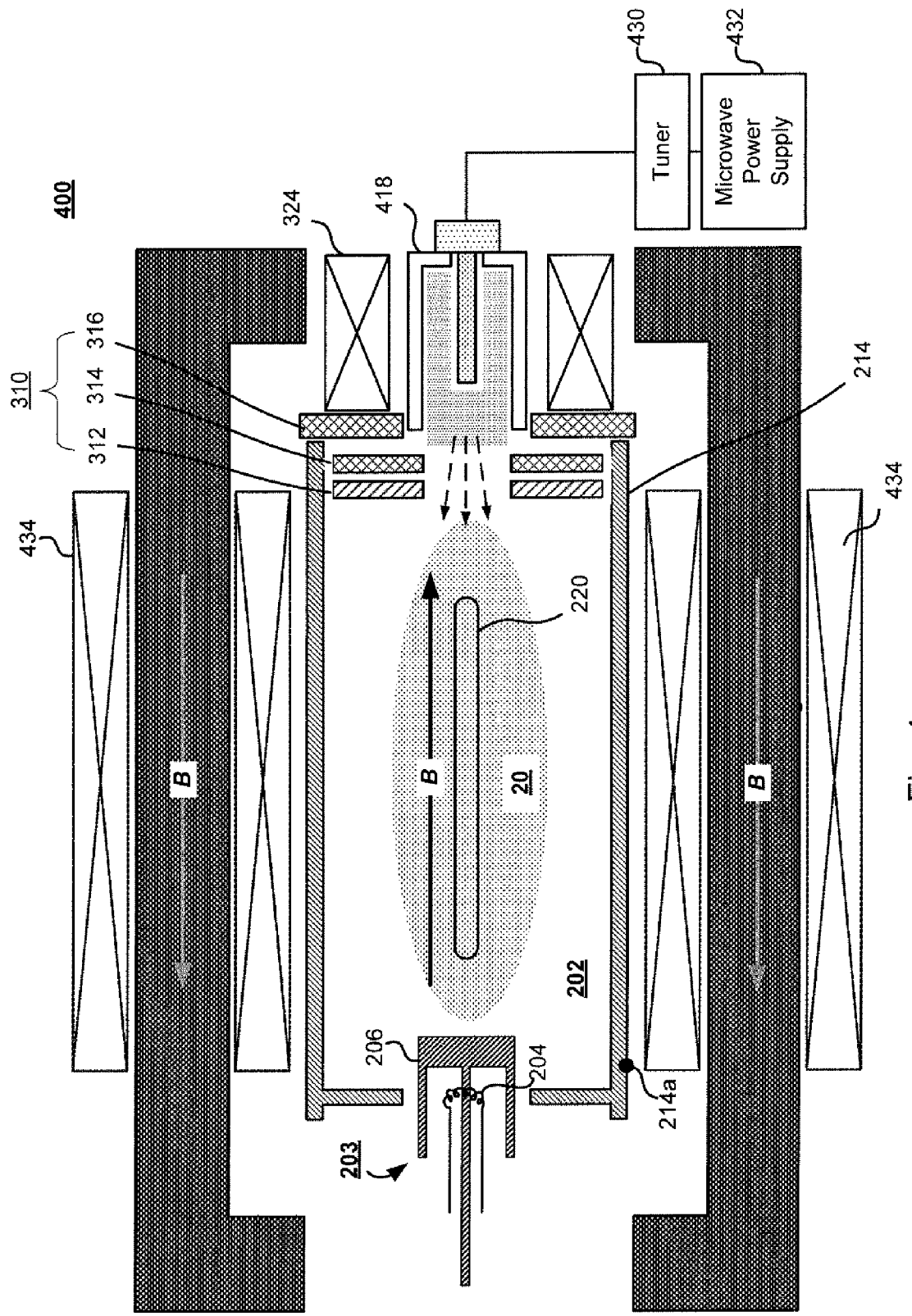
FIG. 4 depicts a multimode ion source according to an alternative embodiment of the present disclosure.

FIG. 4 depicts a multimode ion source 400 according to an alternative embodiment of the present disclosure. In this example, the multimode ion source 400 may include all of the components of the multimode ion source 300B of FIG. 3B. For example, a source magnet 434 may be configured similar to the source magnet 334b of FIG. 3B. Other various source magnet configurations may also be provided. However, the plasma source/generator of FIG. 4 may be an electron cyclotron resonance (ECR) auxiliary discharge chamber 418. In this example, power for plasma generation is provided by using a tuner 430 and a microwave power supply 432, which are electrically and/or magnetically coupled to the auxiliary chamber 418. The auxiliary source 418 may operate at lower gas pressures, thereby allowing lower pressure in the arc chamber 202 and increased molecular beam current. In addition, the auxiliary source 418 may use the same gas used in the arc chamber 218. In one embodiment, when the auxiliary source 418 uses an auxiliary gas, auxiliary source 418 operation may be optimized to achieve minimal gas flow. In another embodiment, the auxiliary source 418 may be used as a cathode auxiliary source. In this example, a reduction in dilution of the main dopant species by the plasma cathode species may be achieved. Other various embodiments may also be provided.

Figure 5A:
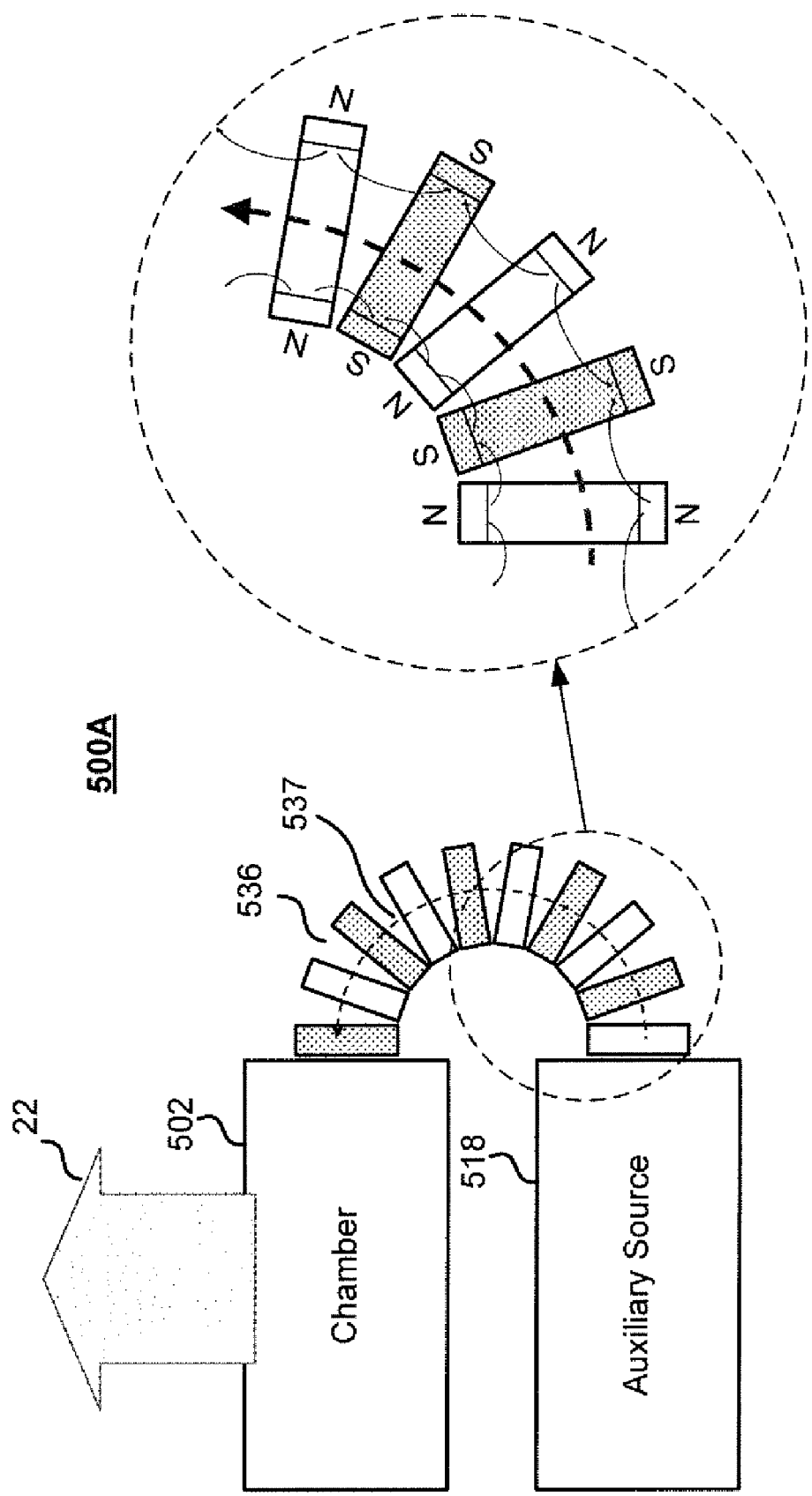
FIG. 5A depicts a multimode ion source having an auxiliary source configuration according to an embodiment of the present disclosure.

In one embodiment, a set of permanent magnets or a magnetic coil may be used to provide a magnetic field for ECR condition and confinement. For example, FIG. 5A depicts a multimode ion source 500A having an auxiliary source configuration according to an alternative embodiment of the present disclosure. In this example, the multimode ion source 500A may include an auxiliary (plasma) source 518 positioned below an arc chamber 502. In one embodiment, the auxiliary source 518 may be a Helicon source. In another embodiment, the auxiliary source 518 may be an ECR (or microwave) source. In yet another embodiment, the auxiliary source may be an inductively coupled plasma (ICP) source. Other various auxiliary source types and/or embodiments may also be provided. It should be appreciated that the auxiliary plasma source 518 may be controlled locally or remotely. It should also be appreciated that while embodiments of the present disclosure depict the auxiliary source 518 positioned below the arc chamber 502, other various positions away from the arc chamber may also be provided.

Plasma generated in the auxiliary source 518 may be transported into the main arc chamber 502 by means of a plasma pipe 536. The plasma pipe 536 may include a plurality of individual ring magnets that form a multi-cusp arrangement. In one embodiment, the plurality of individual ring magnets of the plasma pipe 536 may be radially magnetized to form a strong multi-cusp field inside the pipe to provide optimal plasma confinement, as depicted in FIG. 5A. This may be important for reliably transporting ionized gases in a plasma flow 537 from the auxiliary source 518 to the arc chamber 502.

In addition, a plasma pipe 536 may rely on a strong mirror ratio (e.g., B field at an inner wall of the arc chamber 502, B field at pitch distance from the wall, etc.). Accordingly, the individual ring magnets may be aluminum plated to avoid contamination while providing good electrical contact, when necessary. Other various conductive non-contaminating materials may also be provided.

It should also be appreciated that while embodiments of the present disclosure are directed towards multimode ion sources, other applications and/or configurations may also be provided. For example, FIG. 5B depicts an ion source 500B having an auxiliary source configuration according to an alternative embodiment of the present disclosure. Similar to the ion source 500A of FIG. 5A, the ion source 500B of FIG. 5B may include an arc chamber 502 and an auxiliary chamber 518. However, in FIG. 5B, a dual plasma feed may be utilized. For example, the plasma pipe 536 may couple the auxiliary source 518 to the arc chamber 502 at one end and an additional plasma pipe 538 may couple the auxiliary source 518 to the arc chamber 502 at the other end, as depicted in FIG. 5B. In this example, there may be two paths (e.g., plasma flow 537, 539) for reliably transporting ionized gases from the auxiliary source 518 to the arc chamber 502.

It should be appreciated that in this configuration, the ion source 500B may be limited to cold high frequency plasma operation. The reason is because only one type of source (e.g., for one mode of operation) may be coupled to the arc chamber 502 at a given time. However, an advantage of such a configuration, even for a single operation in cold high frequency plasma implantation may be improved plasma uniformity, density, and control within the arc chamber 502 since ionized gases may be equally distributed at both sides of the arc chamber 502.

In addition, embodiments of the present disclosure using plasma pipes may be applied to cleaning inner surfaces of arc chambers. For example, deposition and unwanted insulating materials may form on the walls of arc chambers of ion sources. Therefore, a plasma pipe, as described above with regards to FIGS. 5A and 5B, may provide a feed gas, such as $NF_3$, which produces highly reactive halogen radicals, to an arc chamber to etch inner surfaces thereof. Such a cleaning procedure may be necessary whenever an ion source preventive maintenance is performed. Other various embodiments may also be provided.

It should be appreciated that while embodiments of the present disclosure are directed to multimode ion sources that operate in hot cathode mode and a radio frequency (RF) mode, other various modes of operation may be provided as well. These may include other indirect and/or high frequency modes of operation, such as hollow cathode discharge mode, cold plasma cathode mode, etc.

It should also be appreciated that while embodiments of the present disclosure are described using decaborane, other implantation species may also be provided. For example, molecular ions, such as diborane, pentaborane, carborane, and octaborane, may be used to generate an ion beam. In addition, atomic ions, such as boron, arsenic, phosphorus, indium, and germanium, may also be used.

It should also be appreciated that the disclosed embodiments not only provide several modes of operation, but that these various modes may provide additional implantation customizations that would not otherwise be readily provided. For example, a single multimode ion source may be configured to operate in various modes in a particular sequence (e.g., a specific implantation recipe). As a result, using several modes of operation, in addition to using various molecular ions and/or atomic ions in this process, may provide a customized ion implantation sequence that is tailored to any specific implantation need of a particular user. Other various embodiments may also be provided.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

The invention claimed is:

1. An apparatus for ion implantation, the apparatus comprising:
an ion source comprising hot cathode and a high frequency plasma generator, wherein the ion source has multiple modes of operation.

2. The apparatus of claim 1, wherein the ion source operates in a first mode using the hot cathode, wherein the first mode is a hot mode operation.

3. The apparatus of claim 1, wherein the ion source operates in a second mode using the high frequency plasma generator, wherein the second mode of operation is a cold mode operation.

4. The apparatus of claim 3, wherein the high frequency plasma generator comprises at least one of an inductively coupled plasma (ICP) generator, a helicon plasma generator, and a microwave plasma generator.

5. The apparatus of claim 1, wherein the ion source operates in a third mode of operation using the hot cathode and the high frequency plasma generator.

6. The apparatus of claim 1, wherein the high frequency plasma generator is coupled to the ion source by at least one plasma pipe.

7. The apparatus of claim 6, wherein the high frequency plasma generator is remotely controlled.

8. A multi-mode ion source, the ion source comprising:
a chamber;
a hot cathode; and
a high frequency plasma generator;
wherein the ion source has multiple modes of operation.

9. The multi-mode ion source of claim 8, wherein the ion source operates in a first mode using the hot cathode.

10. The multi-mode ion source of claim 8, wherein the ion source operates in a second mode using the high frequency plasma generator.

11. The multi-mode ion source of claim 10, wherein the high frequency plasma generator comprises at least one of an inductively coupled plasma (ICP) generator, a helicon plasma generator, and a microwave plasma generator.

12. A method for generating ions in an ion source, the method comprising:
providing a first mode of operation based on a hot cathode; and
providing a second mode of operation based on a high frequency plasma generator.

13. The method of claim 12, wherein the high frequency plasma generator comprises at least one of an inductively coupled plasma (ICP) generator, a helicon plasma generator, and a microwave plasma generator.

14. The method of claim 12, further comprising providing a third mode of operation based on the hot cathode and the high frequency plasma generator.

* * * * *